United States Patent [19]

Nadkarni et al.

[11] Patent Number: 4,915,924

[45] Date of Patent: Apr. 10, 1990

[54] METHOD OF PREPARING WHISKERS OF SILICON CARBIDE AND OTHER MATERIALS

[75] Inventors: Sadashiv K. Nadkarni; Mukesh K. Jain, both of Jonquiere, Canada

[73] Assignee: Alcan International Limited, Montreal, Canada

[21] Appl. No.: 230,747

[22] Filed: Aug. 10, 1988

[30] Foreign Application Priority Data

Aug. 12, 1987 [CA] Canada .................................. 544348

[51] Int. Cl.⁴ ............................................ C01B 31/36
[52] U.S. Cl. ..................................... 423/345; 425/346
[58] Field of Search ................................ 423/345, 346

[56] References Cited

U.S. PATENT DOCUMENTS

| | | | |
|---|---|---|---|
| 4,284,612 | 8/1981 | Horne et al. | 423/345 |
| 4,504,453 | 3/1985 | Tanaka et al. | 423/345 |
| 4,536,379 | 8/1985 | Carlson et al. | 423/345 |
| 4,591,497 | 5/1986 | Tanaka et al. | 423/345 |
| 4,637,924 | 1/1987 | Beatty et al. | 423/345 |
| 4,752,456 | 6/1988 | Yoda et al. | 423/346 |

FOREIGN PATENT DOCUMENTS

| | | |
|---|---|---|
| 0170362 | 2/1986 | European Pat. Off. . |
| 2522024 | 2/1983 | France . |
| 59-128300 | 7/1964 | Japan . |
| 57-111300 | 7/1982 | Japan . |
| 58-223698 | 2/1983 | Japan . |
| 59-9519 | 3/1984 | Japan . |
| 1121293 | 10/1964 | United Kingdom . |
| 2116533 | 9/1983 | United Kingdom . |

OTHER PUBLICATIONS

Abstract J58045197 High Quality Silicon Carbide Whiskers Mfr.
Silicon Carbide Fiber and Its Production, Abstract 83-223698.
Abstract 83-045197, Mfr. of High Quality Silicon Carbide Whiskers.
Japanese Patent Publication 61-227,995—Production of SiC Whisker, Patent Abstracts of Japan-vol. 11, No. 69, Mar. 3/87 (Abstract only).
Japanese Patent Publication No. 58-45197—Manufacture of High Quality Silicon Carbide Whiskers—Patent Abstracts of Japan, vol. 7, No. 131, Jun. 8, 1983 (Abstract only).
Oak Ridge National Laboratory—"Carbothermal Synthesis of Silicon Carbide", Janney et al.—published May 1985.
Wei et al. article—"Synthesis of Sinterable SiC Powders by . . . ", Ceramic Bulletin, vol. 63, No. 8 (1984).
J. Lee et al.—"Formation of Silicon Carbide from Rice Hulls", Ceramic Bulletin, vol. 54, No. 2 (1975).

Primary Examiner—Robert L. Stoll
Assistant Examiner—Lori F. Cuomo
Attorney, Agent, or Firm—Cooper & Dunham

[57] ABSTRACT

A method of producing whiskers of silicon carbide and other materials. For the formation of silicon carbide, the method involves forming a first reaction zone containing microfine particles of silicon dioxide uniformly mixed with carbon or a carbon precursor, with the ratio of the silicon dioxide to the carbon present as a starting material or derivable from the precursor being greater than about 5 to 1 by weight. A closely adjacent second reaction zone is formed containing a porous fibrous mass of active carbon or an infusible carbon precursor. The reaction zones are heated under a non-oxidizing atmosphere to temperatures at which silicon monoxide is formed in the first reaction zone, diffuses to the second reaction zone and reacts with carbon derived from the carbon precursor in the second reaction zone to form silicon carbide whiskers. A continuous supply of a whisker-forming catalyst is provided in the second reaction zone, at least in the vicinity where the silicon monoxide and carbon react with each other. This can be assured, for example, by providing the whisker-forming catalyst in the first reaction zone together with a catalyst volatilizing aid which enables the catalyst to diffuse to the second reaction zone along with the SiO. The first reaction zone may also contain a catalyst for the SiO producting reaction. By changing the starting materials, reaction temperatures etc. but using the same method steps, whiskers of other materials such as AlN, sialons, $Si_{3}N_{4}$ etc. can also be prepared.

34 Claims, 5 Drawing Sheets

METHOD OF PREPARING WHISKERS OF SILICON CARBIDE AND OTHER MATERIALS

BACKGROUND OF THE INVENTION

I. Field of the Invention

This invention relates to methods of preparing whiskers of silicon carbide and other materials e.g. AlN, sialons, $Si_3N_4$, etc.

II. Description of the Prior Art

Whisker-form products are of increasing interest these days in view of the ever expanding requirement for new materials. For example, whisker-like crystals of silicon carbide are extremely hard and exhibit great tensile strength, and so are currently in great demand for a variety of purposes, e.g. as reinforcements for ceramic or metal matrix composites.

A variety of routes for the formation of silicon carbide whiskers and whiskers of other materials have been investigated, including both gas-phase reactions and solid-phase reactions. However, the yields tend to be poor, which makes the product expensive, and the whiskers are often contaminated with particulates, with unreacted starting material or with material from the reaction environment.

When silicon carbide whiskers are produced by heating silica to high temperature in the presence of carbon, the product is mainly powder- or lump-form silicon carbide. The growth of whiskers can be encouraged by providing a catalyst for whisker growth and voids in the carbon mass in which the whiskers can grow. However, the product inevitably contains a significant amount of powder-form silicon carbide which is troublesome to remove from the desired whiskers.

Improvements in this procedure have recently been reported by Tokai Carbon KK (Japanese Patent Application 59 9519 published on Mar. 2, 1984) and by Asahi Chemical Industry Co. Ltd. (Japanese Patent Application 58 223698 published on Dec. 26, 1983). The Tokai process involves reacting $SiO_2$ obtained from chaff ash and carbon black under an inert gas, e.g. argon, at high temperature to produce volatile SiO in a first reaction zone and then causing the SiO to react with porous or fibrous carbon material in a second reaction zone. While this process reputedly produces β-SiC whiskers of high purity, the yields of the whiskers are very low and this may be due to the formation of SiC in the first reaction zone as well as the desired gaseous SiO.

The Asahi process is similar to the Tokai process except that it is designed to produce fibres made up of SiC whiskers and it employs a yttrium compound as a catalyst for the whisker formation. Despite the use of the catalysts, the yield of whiskers is quite low and the purity of the resulting SiC is not stated.

In view of these problems, the Tokai and Asahi processes are not entirely satisfactory and there is a need for an alternative method of producing SiC whiskers of high purity in good yields and at relatively low cost.

SUMMARY OF THE INVENTION

According to one aspect of the present invention there is provided a method of producing whiskers of silicon carbide, which comprises: forming a first reaction zone containing microfine particles of silicon dioxide uniformly mixed with carbon or a carbon precursor, the ratio of the silicon dioxide to the carbon present as a starting material or derivable from the precursor being greater than about 5 to 1 by weight; forming a closely adjacent second reaction zone containing a porous mass of an infusible carbon precursor or active carbon; heating both reaction zones under a non-oxidizing atmosphere to reaction temperatures at which silicon monoxide is formed in the first reaction zone, diffuses to the second reaction zone and reacts with said active carbon or carbon derived from said carbon precursor in the second reaction zone to form silicon carbide; and making a fresh supply of a whisker-forming catalyst continuously available in said second reaction zone at least in a vicinity where said silicon monoxide and carbon react with each other.

In another aspect of the invention, whiskers of AlN, sialons, $Si_3N_4$ etc. are prepared in an equivalent way by using a molar excess of the starting oxide in the first reaction zone to ensure virtually exclusive formation of the volatile intermediate sub-oxide (SiO or $Al_2O_2$, depending on the starting material), and by varying the reaction conditions to favor the formation of the desired material in the second reaction zone. For example, $Si_3N_4$ can be formed in the second reaction zone rather than SiC by providing $N_2$ in the non-oxidizing atmosphere and by reducing the reaction temperatures below that required to form the SiC.

By the term "microfine" as used throughout the disclosure and claims we mean particles of average size less than about 5 microns and normally less than one micron, and by the term "whiskers" we mean elongated particles generally made of crystalline material. By the term "carbon precursor", we mean a compound which is converted to carbon when heated in a non-oxidizing atmosphere at a carbonization temperature, normally within the range of 500°–750° C.

DETAILED DESCRIPTION OF THE INVENTION

Figure 1:
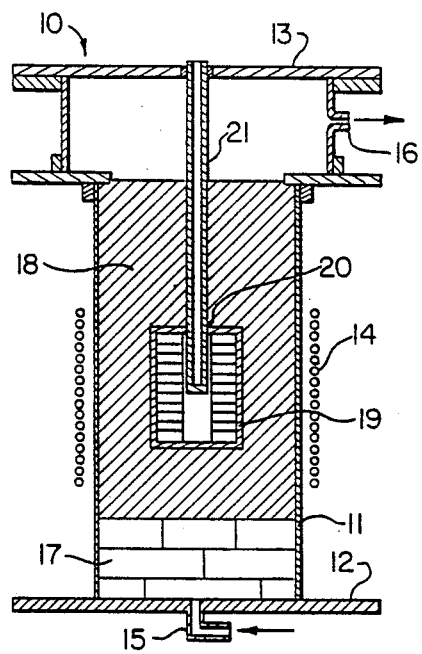
FIG. 1 is a cross section of an induction furnace containing a graphite reactor.

It is known that silica reacts with carbon to produce silicon carbide via two reaction steps:

$$SiO_2 + C \rightarrow SiO \uparrow + CO \qquad (1)$$

$$SiO + 2C \rightarrow SiC + CO \qquad (2)$$

The stoichiometric weight ratio of silica to carbon in reaction (1) is 5:1. The stoichiometrical weight ratio for the formation of silicon carbide from silica (reactions (1) plus (2)) is 1.67 : 1 for silica to carbon.

The inventors of the present invention believe that the relatively low yields obtained in the Tokai and Asahi processes referred to above are due in part to the use of a molar excess of carbon to silicon dioxide in the first reaction zone. For example, the Tokai application recommends the use of 110–400 wt. % of carbon black in the mixture containing chaff ash. The Examples in the Asahi application make use of mole ratios of 5.35 : 1, 3.3 : 1 and 4 : 1 for C : $SiO_2$. Rather than being beneficial in order to ensure that all of the $SiO_2$ starting material is reacted, the inventors believe that the use of an excess of carbon in the first reaction zone is harmful to the yield of the desired product because it promotes the formation of silicon carbide powder in the first reaction zone.

The inventors have found that the formation of SiC in the first reaction zone can be substantially completely prevented if the molar ratio of silica to carbon is greater than 1, i.e. if the weight ratio of silica : carbon is >5:1 and is preferably at least 6:1. When such ratios are employed, only reaction (1) above takes place and SiO is virtually exclusively formed. While some $SiO_2$ remains unreacted in the first reaction zone, virtually the entire amount of $SiO_2$ that does react is eventually converted to carbide whiskers in the second reaction zone. The fact that some $SiO_2$ remains unreacted in the first reaction zone is also beneficial when impure $SiO_2$ is used as the starting material because the impurities remain in the excess silica and can easily be removed from the product. Theoretically, there is no upper limit to the silica : carbon ratio, i.e. it may be much higher than 6:1 (by weight), but as a practical matter it is undesirable to make the ratio much more than 6:1 (i.e. a 20% by weight excess of silica) because the amount of silicon dioxide remaining unreacted consequently increases and the overall yield falls. The reaction of $SiO_2$ with carbon or carbon precursor to form volatile SiO can be accelerated by using certain catalysts. The inventors have discovered that compounds of alkali and alkaline earth metals (which may be present as impurities in silica from certain sources or may be mixed with the silica), and particularly potassium compounds, apparently catalyze this reaction and thus help to maximize the conversion of $SiO_2$ to SiO.

A second essential feature of the present invention is the making of a fresh supply of a whisker-forming catalyst continuously available in the second reaction zone, at least in the vicinity where the silicon monoxide and carbon react with each other. It is known that whisker growth is promoted or catalyzed by certain materials, e.g. yttrium compounds as mentioned in the Asahi application discussed above. However, when using a process involving two reaction zones, difficulties arise when whisker-forming catalysts are employed. If the catalyst is introduced into the first reaction zone, it may not be transferred to the second reaction zone along with the SiO gas and consequently may not be present in the location where the whiskers grow. If the catalyst is introduced into the second reaction zone in the form of particles, the catalyst may not be present at the carbon surface where the SiO and carbon react. On the other hand, if the catalyst is coated on the carbon surface in the second reaction zone, the catalyst may no longer be available after the first layer of the carbon surface has been consumed. The preferred catalysts for SiC whisker growth are iron compounds, particularly $Fe_2O_3$. It has been found by the inventors that certain materials can apparently make iron compounds volatile at the reaction temperatures employed in the present invention. If one or more of these materials are present in the first reaction zone in conjunction with an iron compound or other catalyst, the catalyst is volatilized and continuously transferred to the second reaction zone along with the SiO gas and is consequently continuously available for catalysis of the whisker growth. Examples of these materials, which may be called catalyst volatilizing aids, are alkali metal salts and oxides, e.g. $Na_2O$ and $K_2O$, and some of these compounds, particularly potassium oxide and salts (e.g. $K_2CO_3$) may act both as catalysts for the SiO-forming reaction as well as whisker-forming catalyst volatilizing aids. A suitable range for a potassium compound (calculated as $K_2CO_3$) is 0.6 to 5.0% by weight of the $SiO_2$ in the first reaction zone. It is not clear exactly how these materials volatilize whisker-forming catalysts, particularly iron compounds but it is theorized that the iron compounds are reduced to iron while the alkali metal is reduced to the corresponding metal and then the iron and alkali metal form a volatile alloy. In any event, tests have shown the presence of iron in the second reaction zone after completion of the reaction when one or more alkali metal oxides were originally present with the iron in the first reaction zone, so clearly volatilization does take place.

Fortuitously, the inventors have found a particular type of silica that contains both iron compounds and alkali metal oxides, which is available as a microfine powder and which has a desired amorphous structure. As a result, this type of silica is the preferred starting material for use in the present invention. The silica in question is the silica produced as a by-product from vapour-phase reactions carried out by the ferrosilicon industry. Silicon and silicon alloys are produced in submerged electric arc furnaces where quartz is reduced to silicon by carbon. SiO vapour is formed during this process and some of this gaseous SiO is entrained in the upper part of the furnace where it oxidizes and condenses to form very fine silica microspheres. A detailed discussion of this type of silica product can be obtained from Ceramic Bulletin, Vol. 63, No. 12 (1984), pp 1487 to 1491. This type of silica is readily available on a commercial scale, e.g. from Elkem Chemicals, Inc. of Pittsburgh, Pennsylvania, USA, and is fairly inexpensive. Typically, the silica of this type contains the following materials:

| material | % by weight |
| --- | --- |
| $SiO_2$ | 92–96.5 |
| C | 1.4–2.2 |
| $Fe_2O_3$ | 0.15–0.50 |
| MgO | 0.20–0.50 |
| $Al_2O_3$ | 0.15–0.50 |
| $K_2O$ | 0.40–1.00 |
| $Na_2O$ | 0.20–0.60 |

Two specific examples (obtained from Elkem) are given as follows:

| material | % by weight | |
| --- | --- | --- |
| $SiO_2$ (amorphous) | 96.5 | 92.5 |
| C | 1.4 | 2.20 |
| $Fe_2O_3$ | 0.15 | 0.35 |
| MgO | 0.20 | 0.50 |
| $Al_2O_3$ | 0.15 | 0.50 |
| $K_2O$ | 0.40 | 1.00 |
| $Na_2O$ | 0.20 | 0.60 |
| Particles less than 45 microns in size | 99.5 | 97.0 |

The average diameters of the silica spheres in the above examples is 0.15 microns.

As noted above, the Na$_2$O and/or K$_2$O appear to enable the normally non-volatile Fe$_2$O$_3$ to be volatilized under the reaction conditions. It has been found that the other impurities in the silica, i.e. MgO and Al$_2$O$_3$, are non-volatile and thus remain in the first zone. The fact that excess silica is present in the first zone means that the non-volatile impurities concentrate in the unreacted silica particles and can easily be removed from the system after the reaction has been completed. These materials consequently do not contaminate the final carbide whisker product.

The two reaction zones are preferably formed by making a first layer of the above-mentioned silica and carbon (or carbon precursor) mixture and a directly overlying layer of the porous mass of the infusible carbon precursor or active carbon. If desired, additional layers can be provided in alternating fashion, i.e. first a layer of the mixture, then a layer of the porous mass, and so on. The layers should be made quite thin, i.e. less than 10 cm, preferably less than 5 cm and more preferably less than 1 cm. This is particularly true when an iron compound is provided as a whisker-forming catalyst in the first reaction zone because, even when volatilizing aids are present, the iron does not diffuse very far into the second reaction zone, and there is no point in making the second zone thicker than the diffusion range of the iron compound. The actual distance of diffusion of the iron compound depends on such factors as the reaction temperature, the rate of flow of the gaseous atmosphere from the first zone to the second, the density of the porous mass in the second reaction zone, etc.

The carbon used in the mixture of the first reaction zone can be particulate carbon, e.g. carbon black or scrap carbon dust, etc. However, rather than use a simple mixture of silica and carbon in the first reaction zone, it is preferable to use a uniform dispersion of microfine silica in a matrix of carbon or a carbon precursor. This ensures that each silica particle is coated with carbon and thus provides a more rapid and complete reaction between the two.

When such a dispersion is used in the first reaction zone, it is preferably in the form of hollow spheres or thin films. These can be formed, for example, by dissolving a carbon precursor such as polyacrylonitrile (PAN) in a suitable solvent (e.g. dimethyl formamide), adding the microfine silica, iron compound (if separate from the silica) and volatilizing aid (if separate from the silica), adding a blowing agent (e.g. NH$_4$HCO$_3$) if a hollow product is required, uniformly dispersing the solids in the solution to form an extremely homogeneous mixture, and shaping the dispersion while removing the solvent, e.g. by extruding or dripping the solution into a non-solvent for the carbon precursor (e.g. water in the case of PAN) which is miscible with the solvent. When the hollow product is desired, the blowing agent is caused to gasify (e.g. by being heated by the non-solvent bath) while the solvent is being removed.

When a carbon precursor, such as PAN, is used, it should be present in the first reaction zone in an amount that produces the desired silica to carbon ratio when carbonization of the precursor takes place as the first zone is heated up to the SiO-forming temperature. For example, PAN produces about 50% by weight of carbon when it is carbonized. Accordingly, the silica to PAN ratio in the first reaction zone should be above 2.5:1 and preferably about 3:1 by weight.

The porous mass forming the second reaction zone is made up of loosely packed fibres, spheres or particles, or a porous solid, of active carbon or of a carbon precursor which does not melt but which is carbonized as the second reaction zone is heated up to the SiC-forming temperatures. By "active" carbon, we mean carbon that is capable of reacting with the SiO gas to form SiC whiskers in good yield in the second zone. Carbon derived from natural or synthetic polymeric precursors, and particularly infusible polymeric precursors, is suitably active. Carbon derived from stabilized PAN is particularly preferred, especially when in the form of fibres. On the other hand, carbon derived from pitch or tar tends not to be suitably reactive. When a carbon precursor, rather than carbon itself, is employed, it is important that the carbon precursor be infusible since the yield of whiskers is significantly decreased if melting of the polymer takes place because melting reduces the porosity of the carbon mass remaining after carbonization has taken place and consequently reduces the surface area for reaction with the SiO and the pores available for whisker growth. In fact, the precursor should be used in such a manner that, when it is converted to carbon, the resulting carbon mass has a large surface area, comprising at least 70% by volume of voids, with substantially all of the voids having a length exceeding 100 $\mu$, at least in one dimension. When carbon itself is employed, the porosity and void size should also preferably be the same. The high porosity of the carbon mass allows for ready infiltration of the SiO from the first zone and the large void size allows for the growth of large whiskers.

Any thermostable polymer may be used as the precursor, e.g. PAN, phenol-formaldehyde or cellulose, etc. When PAN is used, it should be heat stabilized prior to use in order to render it heat infusible. Heat stabilization involves heating the polymer in air at a temperature of between 200° C.–250° C. for several hours to give a polymer product which has a density of about 1.3–1.5 g/cc and an oxygen content of about 8–15%. Table 1 below shows the advantageous effect obtained by heat stabilizing PAN for 16 to 24 hours prior to heating it to carbonization temperatures. At lower stabilization times the stabilization of the precursor fibres is not yet complete and therefore the bulk density of the material increases significantly upon carbonization, thereby limiting the access of the SiO gas and the catalyst.

TABLE 1

RESULTS SHOWING EFFECT OF HEAT STABILIZATION OF PAN (ORLON-Trademark) FIBRES

| Ref. No. | STABILIZATION IN AIR AT 210° C. | | | CARBONIZATION AT 1000° C. | | |
| --- | --- | --- | --- | --- | --- | --- |
| | Duration (Hours) | % Weight Loss | Bulk Density (g/cm$^3$) | Duration (Hours) | % Weight Loss | Bulk Density (g/cm$^3$) |
| S-210-8 | 8 | 1.77 | 0.059 | 1 | 43.28 | 0.368 |
| S-210-12 | 12 | 2.60 | 0.055 | 1 | 38.48 | 0.139 |
| S-210-16 | 16 | 2.40 | 0.084 | 1 | 33.65 | 0.089 |
| S-210-24 | 24 | 3.8 | 0.08 | 1 | 28.46 | 0.089 |

Preferably the carbon precursor is a felt of stabilized PAN fibres, or a product produced from a jumble of staple PAN fibres or hollow spheres produced from PAN or cotton or cellulose pulp (e.g. from recycled newspapers). As noted above, active carbon itself may be employed instead of a carbon precursor e.g. carbon fibres or other porous forms of carbon such as carbon foams from phenol-formaldehyde resins etc.

The use of a carbon precursor rather than carbon itself in the second zone is preferred because it has been found to accelerate the formation of whiskers. This may be because carbon that is freshly produced from a precursor is more reactive with the SiO gas than carbon that has previously undergone a heating step followed by cooling. Thus, to obtain a high yield of SiC whiskers, it is preferable to use a carbon precursor rather than carbon itself in the second reaction zone even though the carbon precursor is most probably completely converted to carbon before the SiO gas enters the second reaction zone. In the event of using paper or cellulose fibres, some processing of the fibres may be required to form a loose fibrous structure desirable for the formation of a satisfactory product. This may involve shredding dried paper pulp (produced by removing lining from wood) such that all fibres are essentially separate and thus form a mass of low bulk density (less than 0.1 g/cm$^3$). It may further be desirable, although not essential, to remove water from the mass by heating it in air at around 300°-400° C. This involves a weight loss of approximately 70-80%. The fibrous mass is then ready to use in a manner very similar to stabilized PAN fibres.

The reactions in the first and second zones take place under a non-oxidizing atmosphere e.g. of argon or $N_2$ or mixtures thereof. The reaction is normally carried out in a reactor that is slowly purged with the gas or gas mixture used to form the non-oxidizing atmosphere. The gas flow should preferably be arranged in such a manner that the gas flows first through the first reaction zone and then through the second reaction zone. This facilitates the diffusion of the SiO gas, as it is produced, from the first reaction zone to the second. However, this is not essential as the SiO produced has sufficient partial pressure at the reaction temperature to diffuse into the second zone without assistance.

The reaction can take place in any suitable reactor, and preferably a graphite-walled reactor is chosen in order to prevent contamination of the whisker product. The reaction temperature (for both zones since they are normally arranged side-by-side) is usually in the range of about 1200 to about 1700 ° C., preferably about 1300-1600 and optimally about 1500° C. The reaction is normally complete after about 2 to 8 hours and the reactor is allowed to cool to ambient temperature before the non-oxidizing atmosphere is removed.

The method of the invention can be operated either batchwise or continuously using apparatus known in the art. Agitation of the starting materials, at least in the first reaction zone, is advantageous, particularly in the continuous process, to ensure that the first and second zones remain in close contact as the material in the first zone shrinks in volume while the reaction proceeds.

The product in the second reaction zone contains whiskers of β silicon carbide and unreacted carbon with no silicon carbide particulates. The whiskers generally have a thickness in the range of 0.5 to 1 μ and an aspect ratio in the range of 20 to 100. The whiskers are generally free of defects such as necking, branching etc. Yields of over 50% by weight can be obtained.

The carbide whiskers can be separated from the unreacted carbon from the second zone by a variety of methods. For example, oxidation in air at a temperature in the range of about 600° to 800° C. causes the carbon to be converted to gaseous CO or $CO_2$. However, as there is a significant difference in size between the unreacted carbon (usually in the form of fibres 10-15 μ in diameter; 1000 μ long) and the SiC whiskers (0.5-1μ diameter; up to 200μlong), the two can be separated by standard methods such as sedimentation, floatation, screening etc. This has the advantage that the oxygen content of the resulting product is less than that which results when separation by oxidation is used.

A similar method to the above can be used to produce $Si_3N_4$ whiskers However, to promote $Si_3N_4$ formation instead of SiC formation in zone 2, the stoichiometrical ratio of the carbon in zone 2 to the SiO formed in zone 1 should be maintained such that 12 parts by weight of carbon are available for 44 parts by weight of SiO. The atmosphere in the reactor should also desirably be 100% $N_2$ or ammonia and an adequate flow of gases should be ensured to complete the reaction to form $Si_3N_4$. The reaction temperature should be maintained at about 1400° C. or more but below 1500° C., and preferably around 1450° C.

The invention is illustrated in further detail by the following Examples, Tests and Comparative Examples.

The procedures described in the Examples and Comparative Examples were carried out in apparatus as shown in the accompanying drawings, and which is briefly described as follows.

The induction furnace 10 consists of a silica tube 11 mounted on a base plate 12 and provided with an enclosed superstructure 13. Induction heating coils 14 are wrapped around the outside of the tube 11 in its central region and the furnace is provided with an inlet 15 and an outlet 16 for a non-oxidizing gas. The furnace contains porous insulating blocks 17 at the bottom of the tube 11, carbon felt insulation 18 located above the blocks, and a graphite reactor 19 embedded in the carbon felt insulation. The reactor 19 has a central vertical hole 20 which receives a graphite tube 21 extending downwardly from the superstructure 13. The tube 21 allows instruments, such as thermocouples or pyrometers, to be inserted into the reactor from outside the furnace to read the reactor temperature, etc.

Gas entering through inlet 15 diffuses through the porous bricks 17 into the carbon felt insulation 18 and then into the graphite reactor tube.

Figure 2:
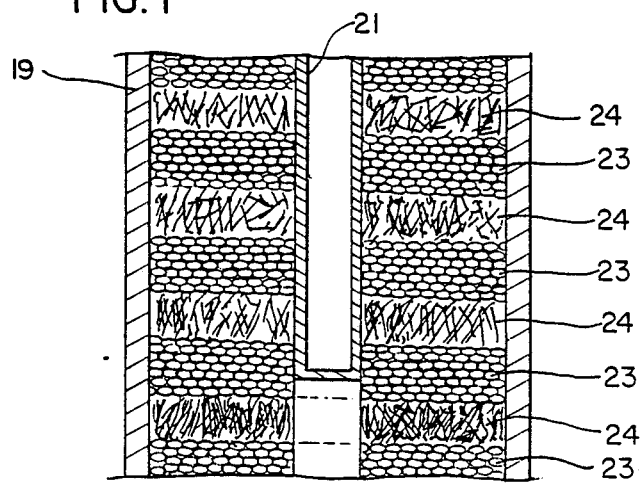
FIG. 2 is a partial cross-sectional view of the graphite reactor shown in FIG. 1 illustrating multiple layers of reactants forming the first and second zones.

The interior of the reactor 19 is shown in detail in FIG. 2. The reaction mass consists of a lower layer of spheres 23 (zone 1) made of carbon or carbon precursor containing microfine silica particles, and an upper layer of carbon or carbon precursor fibres 24 (zone 2). The layer of spheres forms the first reaction zone and the layer of fibers forms the second reaction zone. The layers are then alternately stacked to fill the reactor. The layer thickness in zone 2 is maintained at less than 5 cm and preferably less than 1 cm. The density of this layer is maintained at less than 0.2 g/cc, and preferably less than 0.2 g/cc.

TEST $Fe_2O_3$ (1.002 g), carbon black (5.016 g), $Na_2CO_3$ (2.025 g) and $K_2CO_3$ (2.012 g), were mixed together and heated in a graphite crucible for 2 hours at 1500° C. in an $N_2$ atmosphere. The furnace gases were bubbled through water and analyzed to detect impurities. At the end of the test, shiny particles of Fe were seen to have deposited on the crucible walls up to a height of about 0.5 cm. The analysis of the water indicated the presence of Na:162.3 ppm, K:223 ppm and Fe:0.07 ppm. This test confirms that it is possible to volatilize and transport impurities such as Fe over a short distance.

COMPARATIVE EXAMPLE 1

Extremely pure precipitated $SiO_2$ from Degussa was mixed with carbon black in the proportion of 3:0.5 by weight and 3.006 g of this powder was used as follows. The powder mixture (zone 1) was covered with 1.516 g of carbon fibers (zone 2) in close proximity to the reactant mass. The material was reacted at 1500° C. for 6 hours in an argon atmosphere. The flow rate of argon was 0.8 L/min. The weight of the reactant mass in zone 1 at the end of the test was 1.356 g (45.1% of the original). The carbon fibers in zone 2 weighed 1.449 g. These were oxidized to recover the SiC and only 0.09 g of a coating of SiC could be obtained, that is 3.72% of the carbon in zone 2 reacted to form SiC. This contained insignificant quantities of whiskers.

COMPARATIVE EXAMPLE 2

The experimental conditions in this Comparative Example were identical to those in Comparative Example 2 except $K_2CO_3$ was added (1.2% by weight of $SiO_2$). The weights of the raw materials in the two zones were as follows.

zone 1 : 2.969 g $SiO_2$+C+$K_2CO_3$ zone 2 : 1.499 g carbon fiber

At the end of the test, zone 1 mass was reduced to 0.839 g (28.25% of the original) and the weight of the fibers was 1.498 g. The carbon fibers were oxidized and 0.259 g of a SiC coating was obtained; that is 10.36% of the carbon in zone 2 reacted to form SiC. Practically no whiskers were present in the product mass. The rate of conversion of $SiO_2$ to SiO was considerably enhanced in this test (71.75% material reacted) compared to test 2 (54.9% material reacted) due to presence of $K_2CO_3$ which catalytically accelerated the rate of formation of SiO. This resulted in additional conversion of the carbon to SiC although in the form of a coating rather than whiskers presumably because of the lack of a whisker-forming catalyst. This indicates that by accelerating the rate of formation of SiO in zone 1, the rate of formation of SiC in zone 2 can be accelerated.

EXAMPLE 1

The experimental conditions were identical to Comparative Example 2 except that $Fe_2O_3$ was additionally used (0.2% of the weight of the silica). The weights of the masses in zones 1 and 2 before and at the end of the test were as follows:

|  | Before | After |
|---|---|---|
| zone 1 | 2.504 | 0.570 |
| zone 2 | 1.261 | 1.265 |

In this Example 77.25% of the reactant mass in zone 1 was converted to SiO which was higher than in both Comparative Examples 1 and 2. The product in zone 2 was oxidized to obtain 0.274 g of SiC coating and whiskers. In this test 13% of the carbon in zone 2 reacted which was higher than in both Comparative Examples 1 and 2. Although the whisker yield was low, the presence of catalytic impurities resulted in a higher whisker content in the product.

EXAMPLE 2

Silica from the ferrosilicon industry (SKW) having the composition described below was mixed with carbon black in the proportion of 3:0.5. Carbon fibers were used in zone 2. The reactant masses forming zones 1 and 2 were arranged in 3 alternate layers such that the height of each layer in zone 2 did not exceed 1 cm. The materials were reacted in 90% Ar and 10% $N_2$ atmosphere at a temperature of 1500°. C. for 6 hours. The weights of the reactants before and after the tests were as follows:

|  | Before | After |  |
|---|---|---|---|
| zone 1 | 2.319 g | 0.206 g |  |
| zone 2 | 2.342 g | 2.492 g | 0.704 g after oxidation |

Over 90% of the material in zone 1 had reacted indicating the appreciably higher kinetics formation of SiO while using silica fumes from the ferrosilicon industry. Also, 17% of the carbon in zone 2 had reacted to form SiC which predominently consisted of whiskers. This indicates the effect on whisker growth of the catalytic impurities present in the raw material silica. The analysis of the silica was as follows:

$Al_2O_3$:0.2%
$Fe_2O_3$:0.2%
MgO: 0.7%
$Na_2O$:0.2%
$K_2O$:1.1%

Other impurities such as CaO were also detected, though not analyzed quantitatively.

EXAMPLE 3

Silica from SKW as used in Example 2 was mixed into a 12% solution of PAN (polyacrylonitrile) in DMF so as to maintain a ratio of 3:1 of $SiO_2$ to PAN. $NH_4HCO_3$ (2% by weight) was added to this and hollow spheres were produced by dividing the solution into droplets and dropping them into a 40% DMF mixture in water maintained at 50°-60° C. The hollow spheres thus produced were dried and used as the reactant mass in zone 1. Stabilized PAN fibers (obtained from DuPont - sold under the trademark ORLON) were used as the reactant mass in zone 2. The stabilization was carried out in air at 210° C. for 8 hours. The stabilized fibers were packed so as to obtain a density of approximately 0.1 g/cm³. The spheres and the fibers were arranged in 3 alternate zones. The temperature of the reaction was maintained at 1500° C. and the residence time was 8 hours. An atmosphere consisting of 90% by volume Ar and 10% by volume $N_2$ was maintained in the furnace. The weights of the reactants before and at the end of the test were as follows:

|  | beginning | end | after oxidation |
|---|---|---|---|
| zone 1 | 2.052 g (spheres) | 0.077 g |  |
| zone 2 | 2.086 g (PAN fibers) | 1.334 g | 0.752 g |

Figure 3:
FIG. 3 and FIG. 4 are SEMs of SiC whisker products obtained in one of the Examples.
Figure 4:
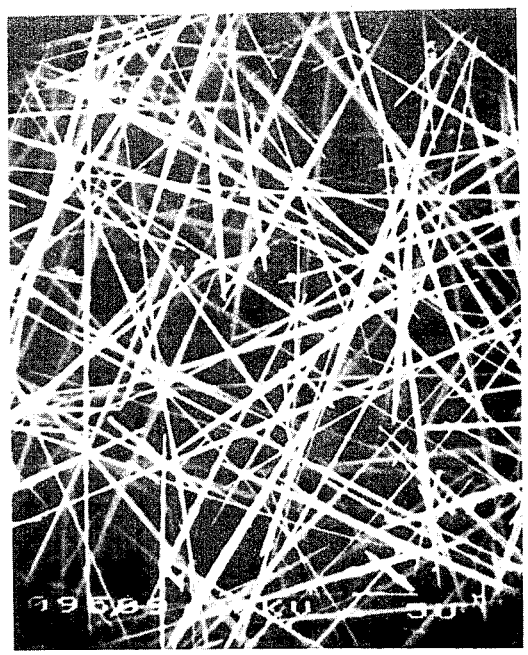

Almost 96% of the mass in zone 1 had reacted and 45% of the carbon in zone 2 had reacted. The product before oxidation is shown by SEM at 600 × magnification in FIG. 3 and carbonized PAN fibres (large flakes) can be seen among the SiC whiskers. The product after oxidation was predominently SiC whiskers with some coatings. The whiskers are shown by SEM at 6000 × magnification in FIG. 4. The increase in conversion relative to Example 1 indicates that use of PAN fibers instead of carbon fibers and the use of PAN-silica spheres instead of $SiO_2$ carbon mixtures increases the yield significantly.

EXAMPLE 4

Waste microfine $SiO_2$ from SKW was homogeneously dispersed in a solution of 12% PAN in DMF, the ratio of $SiO_2$ to PAN being 3:1 by weight. As a blowing agent, 2% by weight of fine powder was additionally dispersed in the solution. The resulting slurry was divided into drops and hollow spheres were prepared by dropping the spheres in a DMF-water bath (40% DMF) held at 55° C. The resulting spheres were used for the first reaction zone and stabilized chopped PAN fibres (sold under the trade mark ORLON) were used for the second reaction zone. The spheres and fibres were placed one above the other in three alternate layers (the spheres forming the lower layer) in a graphite crucible. The weight ratio of spheres to fibres was maintained at approximately 1:1. The total weight of the spheres was 2.15 g and the total weight of the stabilized fibres was 2.18 g. The crucible was placed in a furnace and heated at the rate of 10° C./min to 1500° C. under an atmosphere of 90% Ar and 10% $N_2$. The crucible was held at the stated temperature for 10 hours.

After cooling, the product from both reaction zones was subjected to oxidation by heating in air to above 500° C. The yield of SiC whiskers after the oxidation was 0.81 g and it was found that 96.7% of the reactant mass in the first zones had reacted and 46% of the available carbon in the second reaction zones had reacted to form SiC. No particulate SiC was present. A few carbon fibres which were coated with SiC remained at the end of the test.

Figure 5:
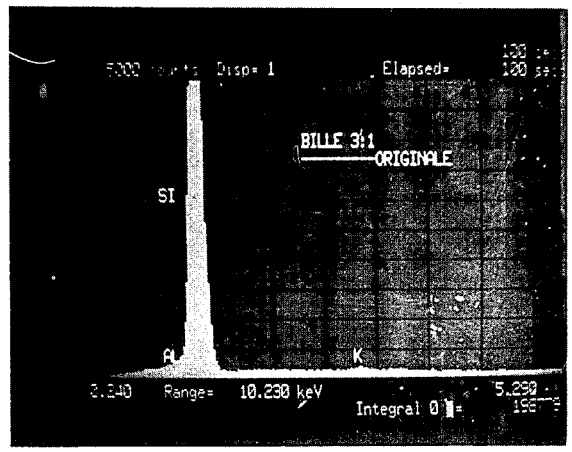
FIGS. 5 to 8 show the results of KEVEX analyses carried out on starting materials or products produced in the Examples.
Figure 6:
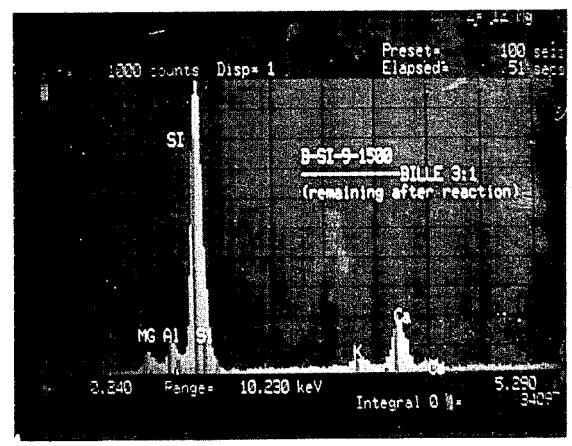
Figure 7:
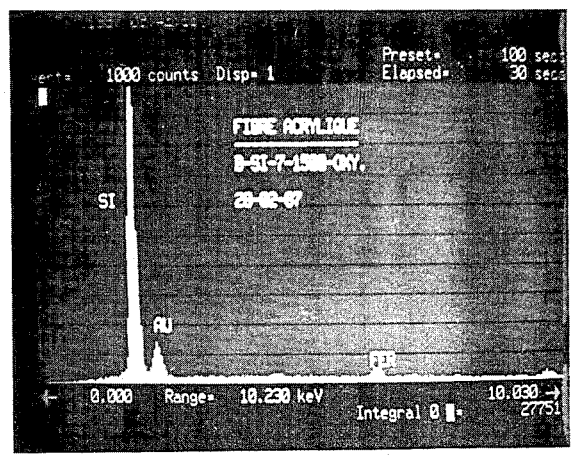
Figure 8:
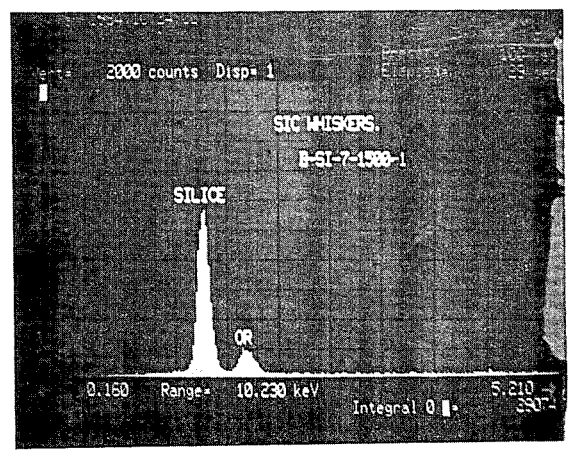

Only 0.07 g of the original 2.15 g of the spheres remained at the end of the test. The original PAN:silica spheres, the silica spheres after reaction, the unreacted carbon fibres in the second zones and the SiC whiskers were analyzed by KEVEX. FIG. 5 shows the analysis of the impurities in the original spheres, and it can be seen that Mg, Ca, K and Fe impurities were present in small quantities. FIG. 6 shows the analysis of the spheres after reaction and it can be seen that all impurities such as Ca, Mg, Al and K are highly concentrated indicating that they were left behind. However, Fe is notably absent indicating that it was volatilized. FIG. 7 shows the analysis of unreacted carbon fibre present in the second zone reaction mass. The Fe impurity in this must have come from the first reaction zone. FIG. 8 shows the analysis of the SiC whiskers and no impurities are revealed. These results support the view that the Fe impurity in the $SiO_2$ is volatilized from the first reaction zone, enters the second reaction zone where it is deposited on the carbon (or PAN) fibres and that it then catalyses the SiC whisker growth.

EXAMPLE 5

Figure 9:
FIGS. 9 and 10 are SEM's of SiC whiskers produced according to other Examples.

Wet wood pulp produced by a paper factory after removing lignin was obtained. It was dried to remove water and then passed through a blender to separate the fibers and produce a low density fibrous mass. The fibers were a few millimeters long and approximately 30-50 μ in dia. and were ribbon shaped. These were arranged in alternate layers along with $SiO_2$-PAN spheres in which the ratio of $SiO_2$ (from SKW) to PAN was 3.65:1. The ratio of spheres to fibres was maintained at 2:1. The thickness of the layer of the fibers was maintained at around 2 mm approximately. The sample was heated under Argon atmosphere to 1700° C. and held at this temperature for 3 hours. At the end of the test the residual spheres were separated from the fibers. 19 g of the fibrous product was obtained starting from 88 g of cellulose fibers. It comprised predominantly SiC whiskers (FIG. 9). No particulates were produced.

EXAMPLE 6

Figure 10:
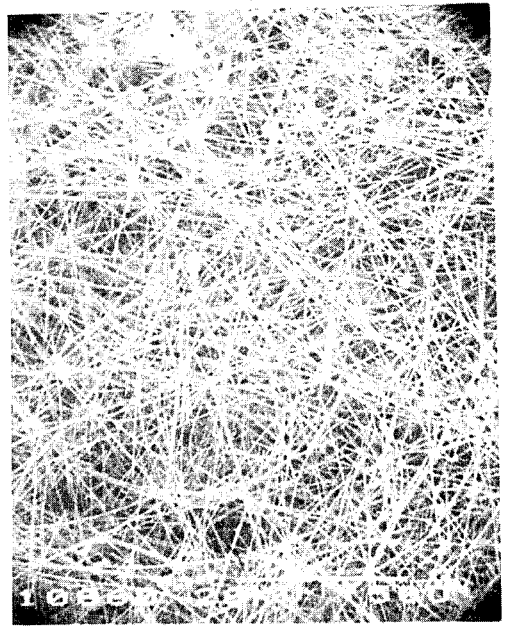

This was identical to Example 5 except that the ratio of spheres to fibres was maintained at 0.8:1. The product once again comprised predominantly SiC whiskers (FIG. 10).

EXAMPLE 7

Hollow spheres containing $SiO_2$ (from SKW) and PAN in the ratio of 3.5:1 were prepared using a 10% solution of PAN in DMF and distributing appropriate amount of the waste $SiO_2$ and adding 2% $NH_4HCO_3$ as a blowing agent. The solution was divided into drops and precipitated in a DMF:water bath (40:60) maintained at 55°-60° C. The resulting hollow spheres were used in the first zone of the reactant mass.

The second reaction zone comprised PAN fibres (ORLON—trademark) which were first stabilised in air at 210° C. for 24 hours.

The spheres (zone 1) and the fibres (zone 2) were arranged in a manner such that the weight ratio of the two was maintained at 3:1 by weight. The thickness of the fibre layer was maintained at 0.5 cms. The bulk density of the fibres was around 0.08 $g/cm_3$. The materials were heated in a graphite crucible under $N_2$ atmosphere at 1550° C. for 6 hours. The product from zone 2 contained SiC whiskers and some unreacted carbon fibres. 82.5% of the carbon fibres in zone 2 were converted to SiC as determined by oxidation.

EXAMPLE 8

Hollow spheres containing silica and PAN (ratio 3.65:1 by weight) were prepared by the technique described in the Examples above.

PAN fibres (ORLON—trademark) were stabilized at 210° C. for 24 hours. The spheres and fibres were organized into alternating layers such that the weight ratio of spheres to fibres was 3:1. The density of the fibre layer was adjusted approximately to 0.05 $g/cm^3$ and its thickness was maintained at around 2.5 mm. The materials were reacted at 1600° C. for 6 hours under Ar. At the end of the test, the fibre layer was full of SiC whiskers. Almost 75% of the carbon was converted to SiC.

COMPARATIVE EXAMPLE 3

The procedure of Example 8 was repeated except that, instead of using stabilized PAN fibres, pitch based carbon fibres from Ashland Petroleum were used. At the end of the test, practically no whiskers were produced. This shows that pitch based carbon fibres have extremely low reactivity compared with stabilized PAN fibres or carbon fibres derived from PAN.

EXAMPLE 9

To determine whether there is an upper limit for the potassium content of the silica, the following two experiments were conducted.

1. Degussa silica and carbon black were mixed together in the proportion of 5:1 by weight. To this, 0.6% of $K_2CO_3$ (by wt. of silica) and 0.25% $Fe_2O_3$ were added. This was used to form the bottom layer in the reactor. The top layer comprised stabilized PAN fibres. The ratio of SiO$_2$: carbon mixture to fibres maintained at 3:1. The weight of the silica carbon mixture was 2.312 g and fibres 0.772 g. These were reacted at 1550° C. for 6 hours in an argon atmosphere. At the end of the reaction, 9.70% of the original bottom layer had reacted, and 39% of the carbon in the upper layer reacted to form SiC. The product comprises SiC whisker and coatings on the fibres.

2. All the conditions were the same as in 1. above except that the percentage of K was 2.4% by weight of SiO$_2$. This time, 91.66% of the material in the bottom zone reacted and 46.36% of the carbon in the upper zone reacted to form SiC. Compared to the first case, there was a slight improvement in the yields and certainly no adverse effect caused by increasing the potassium content. This indicates that having the potassium content in quite low magnitudes is adequate to catalyze the reaction, though higher percentages improve the performance.

What we claim is:

1. A method of producing whiskers of silicon carbide, which comprises:
    forming a first reaction zone containing particles of silicon dioxide having an average size less than about 5 microns uniformly mixed with carbon or a carbon precursor, the ratio of the silicon dioxide to the carbon present as a starting material or derivable from the precursor being greater than about 5 to 1 by weight;
    forming a closely adjacent second reaction zone containing a porous mass of an infusible carbon precursor or active carbon, said porous mass having a density of less than about 0.2 g/cc and said second reaction zone being a layer directly overlying said first reaction zone, less than about 10 cm thick;
    heating both reaction zones under a non-oxidizing atmosphere to reaction temperatures at which silicon monoxide is formed in the first reaction zone, diffuses to the second reaction zone and reacts with said active carbon or carbon derived from said carbon precursor in the second reaction zone to form silicon carbide; and
    making a fresh supply of a whisker-forming catalyst continuously available in said second reaction zone where said silicon monoxide and carbon react with each other by providing said catalyst in the first reaction zone together with a volatilization aid for said catalyst such that the catalyst diffuses from the first reaction zone to the second reaction zone at said reaction temperatures.

2. A method according to claim 1 wherein the ratio of SiO$_2$: C in the first reaction zone is about 6:1 by weight.

3. A method according to claim 1 wherein the catalyst is an iron compound.

4. A method according to claim 3 wherein the iron compound is Fe$_2$O$_3$.

5. A method according to claim 1 wherein the volatilization aid is an alkali metal or alkaline earth metal compound.

6. A method according to claim 5 wherein the alkali metal compound is a potassium compound.

7. A method according to claim 1 wherein the catalyst and the boltailization aid are present as impurities in the silicon dioxide.

8. A method according to claim 1, wherein the silicon dioxide is a by-product of vapour-phase reactions carried out by the ferrosilicon industry and contains an iron compound as said whisker-forming catalyst and at least on alkali metal compound as said volatilization aid.

9. A method according to claim 8 wherein the silicon dioxide has an amorphous structure and a composition comprising:

| Material | % by Weight |
|---|---|
| SiO$_2$ | 92–96.5 |
| C | 1.4–2.2 |
| Fe$_2$O$_3$ | 0.15–0.50 |
| MgO | 0.20–0.50 |
| Al$_2$O$_3$ | 0.15–0.50 |
| K$_2$O | 0.40–1.00 |
| Na$_2$O | 0.20–0.60 |

10. A method according to claim 1, wherein the non-oxidizing atmosphere contains a gas selected from the group consisting of nitrogen and noble gases.

11. A method according to claim 1, wherein the non-oxidizing atmosphere consists essentially of nitrogen gas.

12. A method according to claim 1 which comprises forming said second zone of a porous mass of an infusible carbon precursor.

13. A method according to claim 12 wherein said infusible carbon precursor comprises stabilized fibers of polyacrylonitrile.

14. A method according to claim 12 wherein said infusible carbon precursor comprises cellulose fibres.

15. A method according to claim 14 wherein said cellulose fibres are obtained by drying wet wood pulp from which lignin has been removed, and shredding or grinding said dried wood pulp to form a loose fibrous mass.

16. A method according to claim 1 wherein said silicon dioxide and carbon or carbon precursor forming the contents of the first reaction zone are agitated during said heating step.

17. A method according to claim 1, wherein the porous mass in the second reaction zone comprises, after carbonization if a carbon precursor is employed, at least 70% by volume of voids with substantially all of the voids having a length exceeding 100 μ.

18. A method according to claim 1, wherein the carbon precursor used in the second zone is a polymer selected from the group consisting of heat-stabilized polyacrylonitrile, phenol-formaldehyde and cellulose.

19. A method according to claim 1 wherein the active carbon in the second zone is in the form of fibre.

20. A method according to claim 1 wherein the active carbon in the second zone is derived from a natural or synthetic polymer.

21. A method according to claim 20 wherein the active carbon is in the form of fibres derived from fibres of a natural or synthetic polymer.

22. A method according to claim 21 wherein the active carbon is derived from fibres of heat stabilized polyacrylonitrile.

23. A method according to claim 1, wherein said silicon dioxide in the first zone is uniformly dispersed in the carbon or carbon precursor.

24. A method according to claim 23, wherein the dispersion of silicon dioxide and carbon or carbon precursor is in the form of hollow spheres or films.

25. A method according to claim 1, wherein said reaction temperatures are in the range of 1200°–1700° C.

26. A method according to claim 1, wherein a plurality of said first and second zones are alternately arranged.

27. A method according to claim 1, wherein a catalyst for the silicon monoxide-forming reaction is present in said first reaction zone.

28. A method according to claim 27, wherein said catalyst is a compound of an alkali metal or alkaline earth metal.

29. A method according to claim 27, wherein said catalyst is a compound of potassium.

30. A method according to claim 1 wherein said layer is less than about 5 cm thick.

31. A method according to claim 1 wherein said layer is less than about 1 cm thick.

32. A method according to claim 26 wherein said zones are in the form of layers each having a thickness of less than about 10 cm.

33. A method according to claim 26 wherein said zones are in the form of layers each having a thickness of less than about 5 cm.

34. A method according to claim 28 wherein said zones are in the form of layers each having a thickness of less than about 1 cm.

* * * * *